(12) United States Patent
Yeh

(10) Patent No.: US 10,483,254 B2
(45) Date of Patent: Nov. 19, 2019

(54) ELECTRONIC MODULE AND SEMICONDUCTOR PACKAGE DEVICE

(71) Applicant: Advanced Semiconductor Engineering, Inc., Kaohsiung (TW)

(72) Inventor: Chang-Lin Yeh, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 182 days.

(21) Appl. No.: 15/408,158

(22) Filed: Jan. 17, 2017

(65) Prior Publication Data
US 2018/0204824 A1 Jul. 19, 2018

(51) Int. Cl.
| | |
|---|---|
| *H01L 25/10* | (2006.01) |
| *H01L 23/04* | (2006.01) |
| *H01L 21/56* | (2006.01) |
| *H01L 25/00* | (2006.01) |
| *H01L 23/31* | (2006.01) |
| *H01L 25/11* | (2006.01) |
| *H01L 25/16* | (2006.01) |

(52) U.S. Cl.
CPC .............. *H01L 25/50* (2013.01); *H01L 23/04* (2013.01); *H01L 23/3142* (2013.01); *H01L 25/112* (2013.01); *H01L 25/115* (2013.01); *H01L 25/16* (2013.01); *H01L 21/561* (2013.01); *H01L 23/3121* (2013.01); *H01L 2224/16225* (2013.01); *H01L 2224/48227* (2013.01); *H01L 2224/97* (2013.01); *H01L 2924/1532* (2013.01); *H01L 2924/19041* (2013.01); *H01L 2924/19042* (2013.01); *H01L 2924/19043* (2013.01); *H01L 2924/19105* (2013.01); *H01L 2924/19107* (2013.01)

(58) Field of Classification Search
CPC ... H01L 25/06; H01L 25/065; H01L 25/0657; H01L 25/10; H01L 25/105; H01L 25/50; H01L 23/04; H01L 23/31; H01L 23/312; H01L 23/314; H01L 23/3121; H01L 23/3142; H01L 23/48; H01L 23/481; H01L 23/49; H01L 23/498; H01L 23/4981; H01L 23/49811; H01L 23/4983; H01L 23/49838; H01L 23/4985; H01L 21/56; H01L 21/76; H01L 21/768; H01L 21/768; H01L 21/76802; H01L 21/76877; H01L 21/78
USPC .......................................................... 257/773
See application file for complete search history.

(56) References Cited

U.S. PATENT DOCUMENTS

| | | | |
|---|---|---|---|
| 5,516,704 A * | 5/1996 | Yoshida | ................ H01L 31/048 136/251 |
| 6,617,671 B1 | 9/2003 | Akram | |
| 6,838,776 B2 | 1/2005 | Leal et al. | |

(Continued)

*Primary Examiner* — Monica D Harrison
(74) *Attorney, Agent, or Firm* — Foley & Lardner LLP; Cliff Z. Liu

(57) ABSTRACT

An electronic module includes a first sub-module and a second sub-module. The first sub-module includes a first substrate, a first electronic component disposed on the first substrate and a first electrode. The second sub-module includes a second substrate, a second electronic component disposed on the second substrate and a second electrode spaced from the first electrode. The second electrode faces the first electrode to form a capacitor for transmitting an alternating current (AC) signal between the first sub-module and the second sub-module.

18 Claims, 22 Drawing Sheets

(56) References Cited

U.S. PATENT DOCUMENTS

| | | |
|---|---|---|
| 6,992,376 B2 | 1/2006 | Jaeck |
| 2013/0146991 A1* | 6/2013 | Otremba ............... H01L 25/071 257/401 |
| 2017/0077048 A1* | 3/2017 | Ikeda .................... H01L 23/645 |

* cited by examiner

ELECTRONIC MODULE AND SEMICONDUCTOR PACKAGE DEVICE

BACKGROUND

1. Technical Field

The present disclosure relates to an electronic module, and more particularly, to a flexible electronic module.

2. Description of the Related Art

End users have more electronic device choices than ever before. A number of prominent technological trends currently exist (e.g., mobile electronic devices, smaller electronic devices, increased user connectivity, etc.), and these trends are changing the electronic device landscape. One of the technological trends is electronic devices that can be worn by users, sometimes referred to as wearable electronic devices. To develop a wearable electronic device, a flexible substrate is used for packaging semiconductor devices and/ or modules. However, other structures (e.g., relatively rigid structures such as a dielectric layer, a molding compound, and the like) disposed over the flexible substrate may still be damaged. Therefore, it is desirable to develop a flexible electronic module.

SUMMARY

In one or more embodiments of the present disclosure, an electronic module includes a first sub-module and a second sub-module. The first sub-module includes a first substrate, a first electronic component disposed on the first substrate and a first electrode. The second sub-module includes a second substrate, a second electronic component disposed on the second substrate and a second electrode spaced from the first electrode. The second electrode faces the first electrode to form a capacitor for transmitting an alternating current (AC) signal between the first sub-module and the second sub-module.

In one or more embodiments of the present disclosure, a semiconductor package device includes a substrate, a first electronic component, a first package body and a first electrode. The substrate includes a first surface and a second surface opposite to the first surface. The first electronic component is disposed on the first surface of the substrate. The first package body is disposed on the first surface of the substrate and covers the first electronic component. The first electrode is disposed on a first lateral surface of the first package body. The first electrode is configured to form an electrode of a capacitor to transmit or receive an AC signal.

In one or more embodiments of the present disclosure, a flexible electronic module includes a first sub-module, a second sub-module and a band. The first sub-module includes a first electronic component and a first electrode electrically connected to the first electronic component. The second sub-module includes a second electronic component and a second electrode electrically connected to the second electronic component. The band covers the first sub-module and the second sub-module. An AC signal is transmitted between the first electrode of the first sub-module and the second electrode of the second sub-module through AC coupling.

Figure 1A:
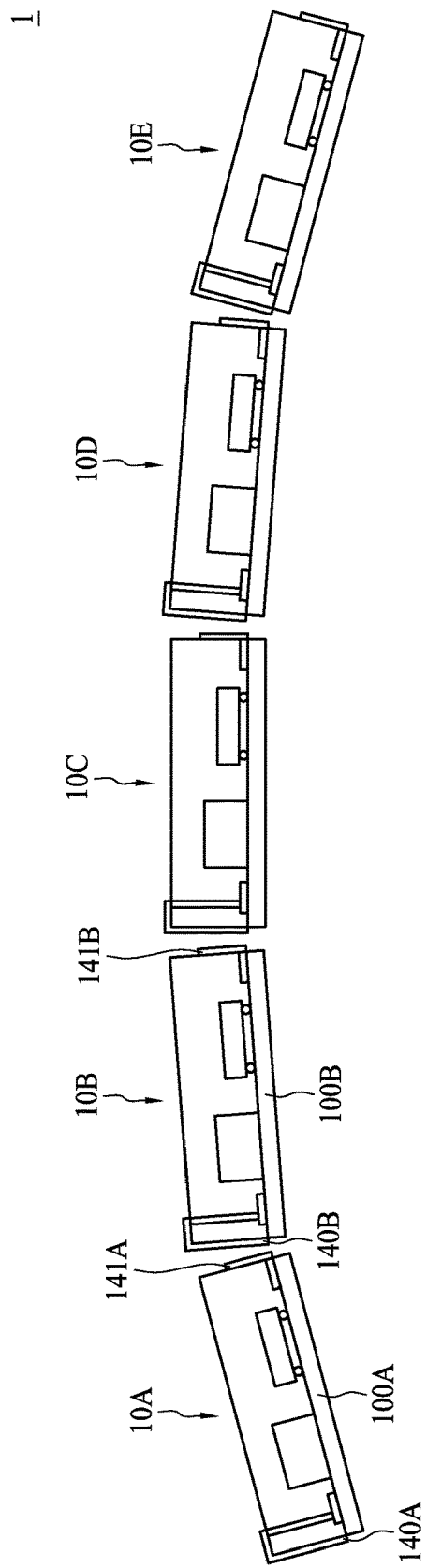
FIG. 1A illustrates a schematic diagram of an electronic device in accordance with some embodiments of the present disclosure.

Common reference numerals are used throughout the drawings and the detailed description to indicate the same or similar components. The present disclosure will be more apparent from the following detailed description taken in conjunction with the accompanying drawings.

DETAILED DESCRIPTION

FIG. 1A is a schematic diagram of an electronic device 1 in accordance with some embodiments of the present disclosure. The electronic device 1 includes a plurality of semiconductor package devices 10A, 10B, 10C, 10D, 10E. The number of the semiconductor package devices can be changed based on design preferences. For example, the electronic device 1 may include two to four semiconductor package devices or more than five semiconductor package devices.

The semiconductor package device 10A includes an electrode 140A disposed on one side thereof and an electrode 141A disposed on an opposite side. As shown in FIG. 1A, the electrodes 140A and 141A are disposed on lateral surfaces of the semiconductor package device 10A. In other embodiments, the electrodes 140A and 141A can be disposed on a top surface of the semiconductor package device 10A. In some embodiments, there is one electrode on each lateral surface of the semiconductor package device 10A. In other embodiments, the number of the electrodes (e.g., more than one) on a single lateral surface can be changed based on design preferences.

The semiconductor package device 10B includes an electrode 140B disposed on one side thereof and an electrode 141B disposed on an opposite side. The electrodes 140B and 141B are disposed on lateral surfaces of the semiconductor package device 10B. In other embodiments, the electrodes 140B and 141B can be disposed on a top surface of the semiconductor package device 10B. In some embodiments, there is one electrode on each lateral surface of the semiconductor package device 10B. In other embodiments, the number of the electrodes (e.g., more than one) on a single lateral surface can be changed based on design requirements.

The electrode 140B of the semiconductor package device 10B is adjacent to the electrode 141A of the semiconductor package device 10A. The electrode 140B of the semiconductor package device 10B and the electrode 141A of the semiconductor package device 10A are spaced apart from each other and face each other to form a capacitor. For example, the electrode 141A and the electrode 140B form two electrodes of the capacitor. An alternating current (AC) signal or power can be transmitted between the semiconductor package device 10A and the semiconductor package device 10B by the coupling of the capacitor formed by the electrode 141A and the electrode 140B. As shown in FIG. 1A, a dielectric material between the electrode 141A and the electrode 140B is air. In other embodiments, other dielectric materials can be disposed between the electrode 141A and the electrode 140B to increase or decrease the dielectric constant of the capacitor.

In some embodiments, a direct current (DC) signal or power can be converted into an AC signal or power by a DC-AC converter within the semiconductor package device 10A, and then the converted signal or power can be transmitted by the coupling of the capacitor. Similarly, the converted AC signal or power can be received and then converted into the DC signal or power by an AC-DC converter within the semiconductor package device 10B.

In some embodiments, a flexible electronic device (such as, but not limited to, a wearable electronic device) may include two or more separated modules electrically connected by a cable to transmit signals therebetween. However, due to metal fatigue of the cable, the reliability of the flexible electronic device may be reduced. As shown in FIG. 1A, the individual electronic modules (e.g., semiconductor package devices 10A, 10B, 10C, 10D and 10E) are in communication with each other by the coupling effect of the capacitors. By using a capacitor or capacitors to transmit signals between two electronic modules, no additional cable is used, which would increase the flexibility of the electronic device 1. In addition, the use of capacitors can prevent malfunction of the electronic device 1 due to breakage of the cable, so as to improve the reliability of the electronic device 1.

In some embodiments, the electronic device 1 may be covered by a cover or a band. The cover or the band is used to protect the electronic device 1 from damage or contamination. In some embodiments, the electronic device 1 with the cover or the band covering thereon may be a watch, a wristband, a necklace or other wearable accessory.

Figure 1B:
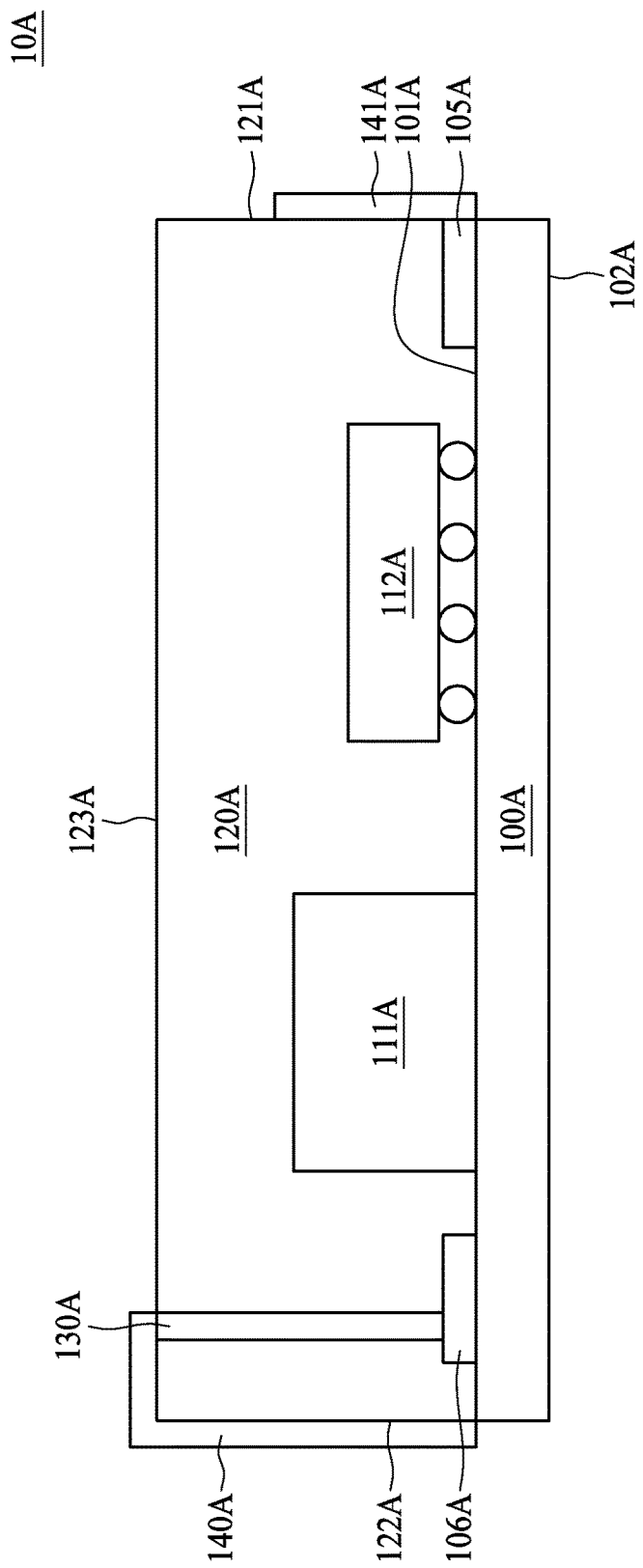
FIG. 1B illustrates a cross-sectional view of a semiconductor package device in accordance with some embodiments of the present disclosure.

FIG. 1B illustrates a cross-sectional view of the semiconductor package device 10A as shown in FIG. 1A in accordance with some embodiments of the present disclosure. The semiconductor package device 10A includes a substrate 100A, electronic components 111A, 112A, a package body or first package body 120A, the electrodes 140A, 141A and a through via 130A.

The substrate 100A may include, for example, a printed circuit board, such as a paper-based copper foil laminate, a composite copper foil laminate, or a polymer-impregnated glass-fiber-based copper foil laminate. In some embodiments, the substrate 100A is flexible. The substrate 100A may include an interconnection structure, such as a redistribution layer (RDL) or a grounding element. The substrate 100A includes a surface 101A and a surface 102A opposite to the surface 101A. The substrate 100A includes conductive pads 105A and 106A disposed on the surface 101A of the substrate 100A. In some embodiments, the surface 101A of the substrate 100A is referred to as a top surface or a first surface and the surface 102A of the substrate 100A is referred to as a bottom surface or a second surface.

The electronic components 111A, 112A are disposed on the top surface 101A of the substrate 100A. The electronic component 111A may be a passive electrical component, such as a capacitor, a resistor or an inductor. The electronic component 112A may be an active component, such as an integrated circuit (IC) chip or a die. Each electronic component 111A, 112A may be electrically connected to one or more of another electronic component (e.g., electronic components 111A, 112A) and to the substrate 100A (e.g., to the RDL), and electrical connection may be attained by way of flip-chip or wire-bond techniques.

The package body 120A is disposed on the top surface 101A of the substrate 100A to cover the electronic components 111A, 112A and to expose a portion of the conductive pad 105A. In some embodiments, the package body 120A includes an epoxy resin having fillers dispersed therein.

The electrode 141A is disposed on a lateral surface 121A of the package body 120A. The electrode 141A is electrically connected to the exposed portion of the conductive pad 105A to receive the signal from the electronic components 111A or 112A and to transmit a signal to an adjacent electrode of another semiconductor package device (e.g., to the electrode 140B of the semiconductor package device 10B). The electrode 141A also can receive a signal from the adjacent electrode of another semiconductor package device (e.g., to the electrode 140B of the semiconductor package device 10B) and transmit the received signal to electronic components 111A or 112A through the conductive pad 105A.

The through via 130A penetrates the package body 120A and electrically contacts the conductive pad 106A on the substrate 100A. The through via 130A is exposed from a top surface 123A of the package body 120A.

The electrode 140A is disposed on a lateral surface 122A and the top surface 123A of the package body 120A. The electrode 140A is electrically connected to the exposed portion of the through via 130A to receive a signal from the electronic components 111A or 112A and to transmit the signal to an adjacent electrode of another semiconductor package device. The electrode 140A also can receive a signal from the adjacent electrode of another semiconductor package device and transmit the received signal to electronic components 111A or 112A through the through via 130A and the conductive pad 106A.

Figure 1C:
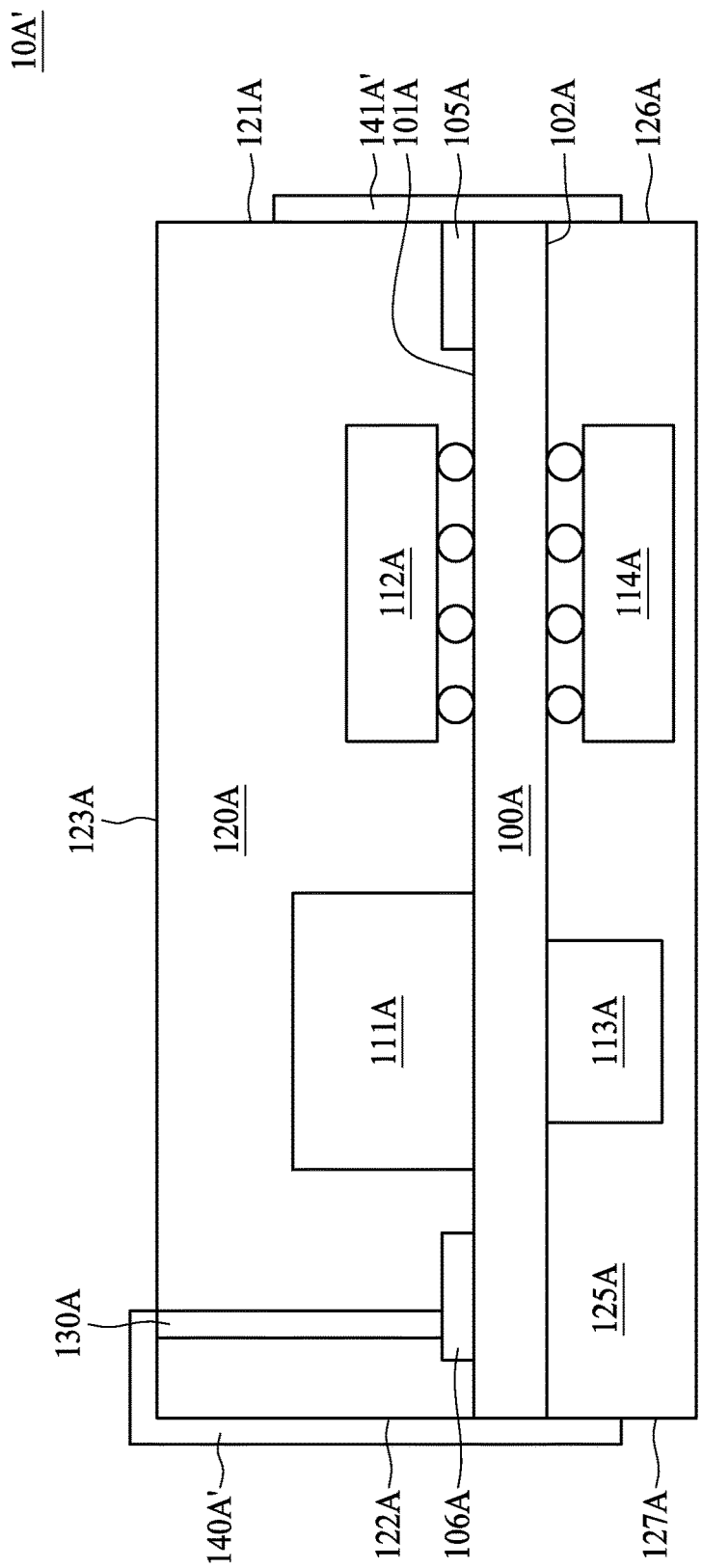
FIG. 1C illustrates a cross-sectional view of a semiconductor package device in accordance with some embodiments of the present disclosure.

FIG. 1C illustrates a cross-sectional view of a semiconductor package device 10A' in accordance with some embodiments of the present disclosure. The semiconductor package device 10A' is similar to the semiconductor package device 10A shown in FIG. 1B except that the semiconductor package device 10A' further includes electronic components 113A, 114A and a package body or second package body 125A.

The electronic components 113A, 114A are disposed on the bottom surface 102A of the substrate 100A. The electronic component 113A may be a passive electrical component, such as a capacitor, a resistor or an inductor. The electronic component 114A may be an active component, such as an IC chip or a die. Each electronic component 113A, 114A may be electrically connected to one or more of another electronic component (e.g., electronic components 111A, 112A, 113A, 114A) and to the substrate 100A (e.g., to the RDL), and electrical connection may be attained by way of flip-chip or wire-bond techniques.

The package body 125A is disposed on the bottom surface 102A of the substrate 100A to cover the electronic components 113A, 114A. In some embodiments, the package body 125A includes an epoxy resin having fillers dispersed therein. The package body 125A includes a lateral surface 126A which is substantially coplanar with the lateral surface of the substrate 100A and the lateral surface 121A of the package body 120A. The package body 125A further includes a lateral surface 127A which is substantially coplanar with the lateral surface of the substrate 100A and the lateral surface 122A of the package body 120A.

An electrode 141A' is disposed on a lateral surface 121A of the package body 120A, the lateral surface of the substrate 100A and the lateral surface 126A of the package body 125A. For example, in comparison with the electrode 141A shown in FIG. 1B, the electrode 141A' further extends from the lateral surface 121A of the package body 120A to the lateral surface 126A of the package body 125A.

The electrode 140A' is disposed on the lateral surface 122A and the top surface 123A of the package body 120A, the lateral surface of the substrate 100A and a lateral surface 127A of the package body 125A. For example, in comparison with the electrode 140A in FIG. 1B, the electrode 140A' further extends to the lateral surface 127A of the package body 125A.

By disposing additional electronic components 113A, 114A on the bottom surface 102A of the substrate 100A, more electronic components can be integrated into a single semiconductor package device, which would in turn reduce a total area of the semiconductor package device.

Figure 2A:
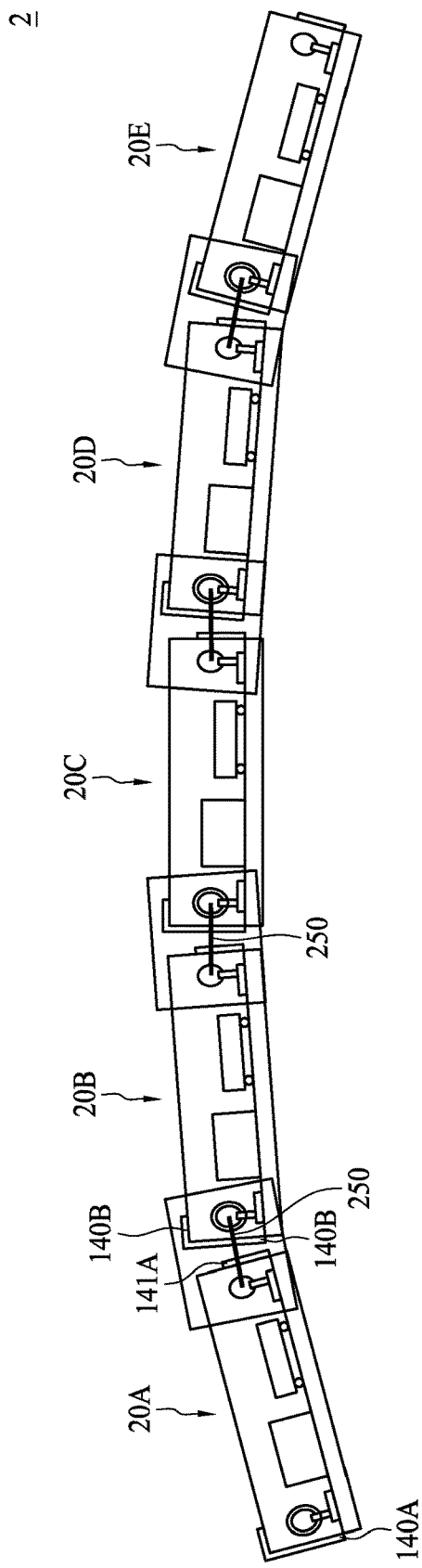
FIG. 2A illustrates a schematic diagram of an electronic device in accordance with some embodiments of the present disclosure.

FIG. 2A is a schematic diagram of an electronic device 2 in accordance with some embodiments of the present disclosure. The electronic device 2 is similar to the electronic device 1 in FIG. 1 except that semiconductor package devices 20A, 20B, 20C, 20D and 20E of the electronic device 2 are further electrically connected by hinges 250.

As shown in FIG. 2A, the semiconductor package device 20A and the semiconductor package device 20B are electrically connected by the hinge 250. In some embodiments, the hinge 250 electrically connects a contact within the semiconductor package device 20A to a contact within the semiconductor package device 20B through openings of the semiconductor package devices 20A and 20B.

As mentioned above, the electrode 141A of the semiconductor package device 20A and the electrode 140B of the semiconductor package device 20B are used to transmit an AC signal or power therebetween. A DC signal or power is transmitted between the semiconductor package device 20A and the semiconductor package device 20B by the hinge 250. By using the coupling of the capacitor to transmit the AC signal or power and using the hinge 250 to transmit the DC signal or power between two individual modules (e.g., the semiconductor package devices 20A and 20B), no AC-DC converter or DC-AC converter is used, which would in turn reduce a manufacturing cost and an area of the electronic device 2.

In some embodiments, the electronic device 2 may be covered by a cover or a band. The cover or the band is used to protect the electronic device 2 from damage or contamination. In some embodiments, the electronic device 2 with a cover or a band covering thereon may be a watch, a wristband, a necklace or other wearable accessory.

Figure 2B:
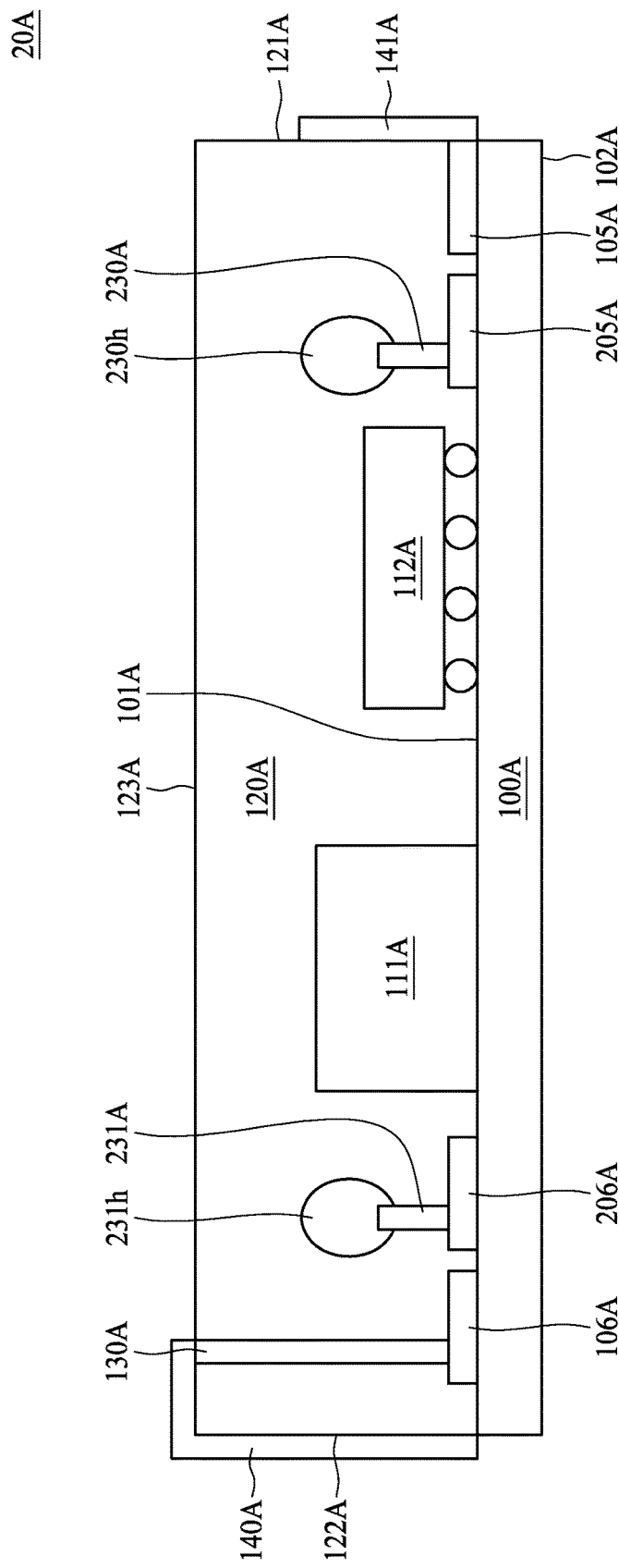
FIG. 2B illustrates a cross-sectional view of a semiconductor package device in accordance with some embodiments of the present disclosure.

FIG. 2B illustrates a cross-sectional view of the semiconductor package device 20A as shown in FIG. 2A in accordance with some embodiments of the present disclosure. The semiconductor package device 20A is similar to the semiconductor package device 10A shown in FIG. 1B except that the semiconductor package device 20A further includes conductive contacts 230A, 231A, openings 230h, 231h and conductive pads 205A, 206A.

The conductive contact 230A is disposed on the conductive pad 205A and encapsulated by the package body 120A. The opening 230h is formed at or near the lateral surface 121A of the package body 120A to expose a portion of the conductive contact 230A to provide an electrical connection for a hinge that connects the semiconductor package device 20A to an adjacent semiconductor package device (e.g., semiconductor package device 20B).

The conductive contact 231A is disposed on the conductive pad 206A and encapsulated by the package body 120A. The opening 231h is formed at or near the lateral surface 122A of the package body 120A to expose a portion of the conductive contact 231A to provide an electrical connection for a hinge that connects the semiconductor package device 20A to an adjacent semiconductor package device.

Figure 3A:
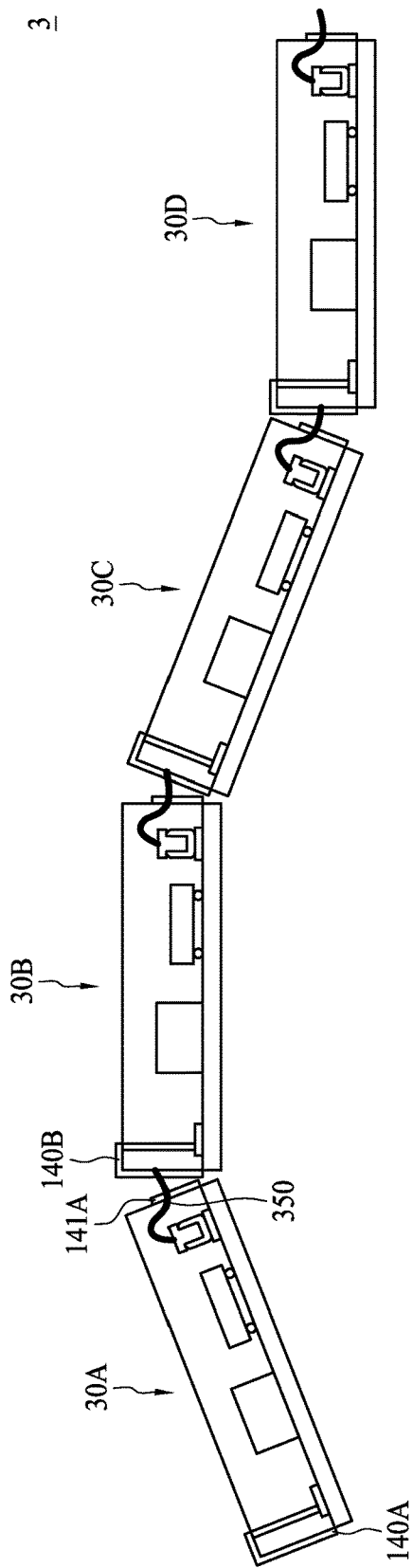
FIG. 3A illustrates a schematic diagram of an electronic device in accordance with some embodiments of the present disclosure.

FIG. 3A is a schematic diagram of an electronic device 3 in accordance with some embodiments of the present disclosure. The electronic device 3 is similar to the electronic device 1 in FIG. 1 except that semiconductor package devices 30A, 30B, 30C and 30D of the electronic device 3 are further electrically connected by conductive lines 350.

As shown in FIG. 3A, the semiconductor package device 30A and the semiconductor package device 30B are electrically connected by the conductive line 350. In some embodiments, the conductive line 350 electrically connects a contact within the semiconductor package device 30A to a contact within the semiconductor package device 30B through openings of the semiconductor package devices 30A and 30B.

As mentioned above, the electrode 141A of the semiconductor package device 30A and the electrode 140B of the semiconductor package device 30B are used to transmit an AC signal or power therebetween. A DC signal or power is transmitted between the semiconductor package device 30A and the semiconductor package device 30B by the conductive line 350. By using the coupling of the capacitor to transmit the AC signal or power and using the conductive line 350 to transmit the DC signal or power between two individual modules (e.g., the semiconductor package devices 30A and 30B), no AC-DC converter or DC-AC converter is used, which would in turn reduce a manufacturing cost and an area of the electronic device 3.

In some embodiments, the electronic device 3 may be covered by a cover or a band. The cover or the band is used to protect the electronic device 3 from damage or contamination. In some embodiments, the electronic device 3 with a cover or a band covering thereon may be a watch, a wristband, a necklace or other wearable accessory.

Figure 3B:
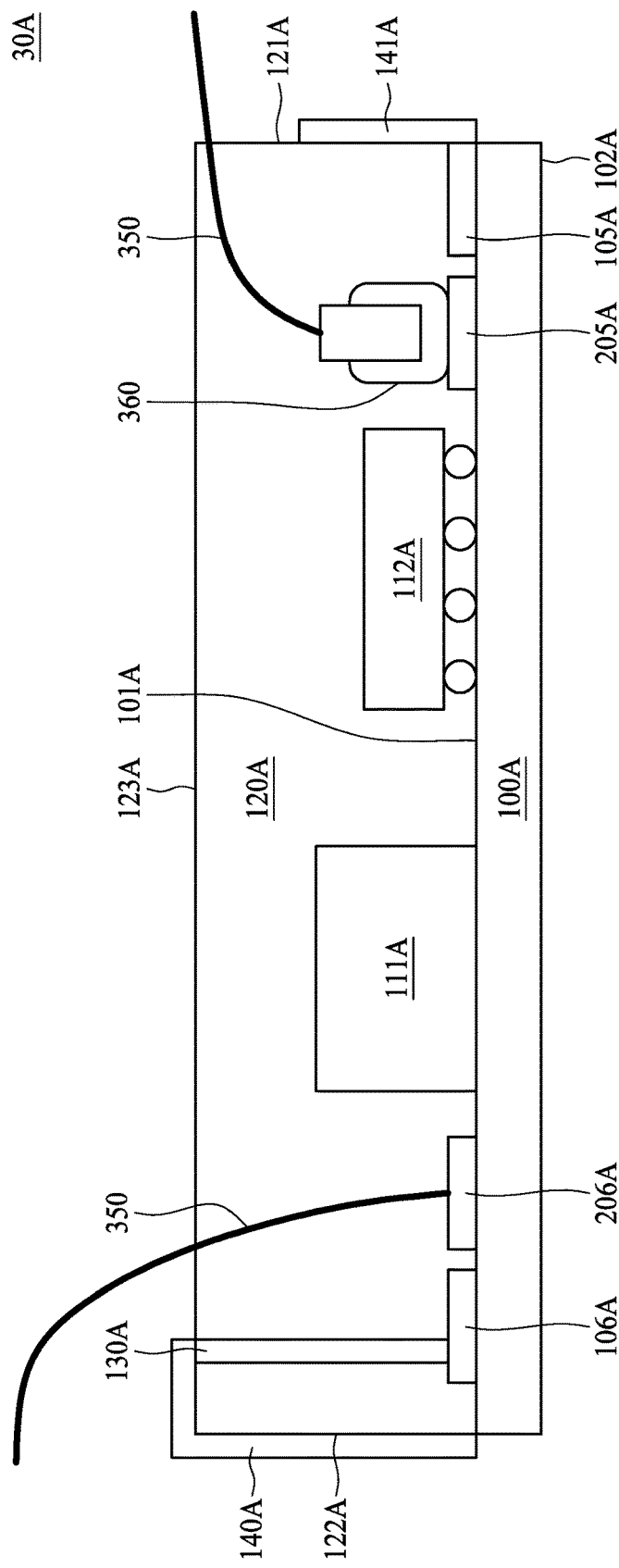
FIG. 3B illustrates a cross-sectional view of a semiconductor package device in accordance with some embodiments of the present disclosure.

FIG. 3B illustrates a cross-sectional view of the semiconductor package device 30A as shown in FIG. 3A in accordance with some embodiments of the present disclosure. The semiconductor package device 30A is similar to the semiconductor package device 20A shown in FIG. 2B except that the semiconductor package device 30A includes a socket 360 and conductive lines 350.

The socket 360 is disposed on the conductive pad 205A and encapsulated by the package body 120A. An opening is formed at or near the lateral surface 121A of the package body 120A to expose a portion of the socket 360 to provide an electrical connection for the conductive line 350 that connects the semiconductor package device 30A and an adjacent semiconductor package device (e.g., the semiconductor package device 30B). In some embodiments, the conductive line 350 can be directly connected to the conductive pad 206A to provide an electrical connection between the semiconductor package device 30A and an adjacent semiconductor package device.

The conductive lines 350 are connected to the conductive pads 205A, 206A and are encapsulated by the package body 120A. A part or portion of the conductive lines 350 extends outside of the package body 120A to provide an electrical connection between the semiconductor package device 30A and an adjacent semiconductor package device.

FIGS. 4A-4F illustrate a method of manufacturing a semiconductor package device in accordance with some embodiments of the present disclosure.

Figure 4A:
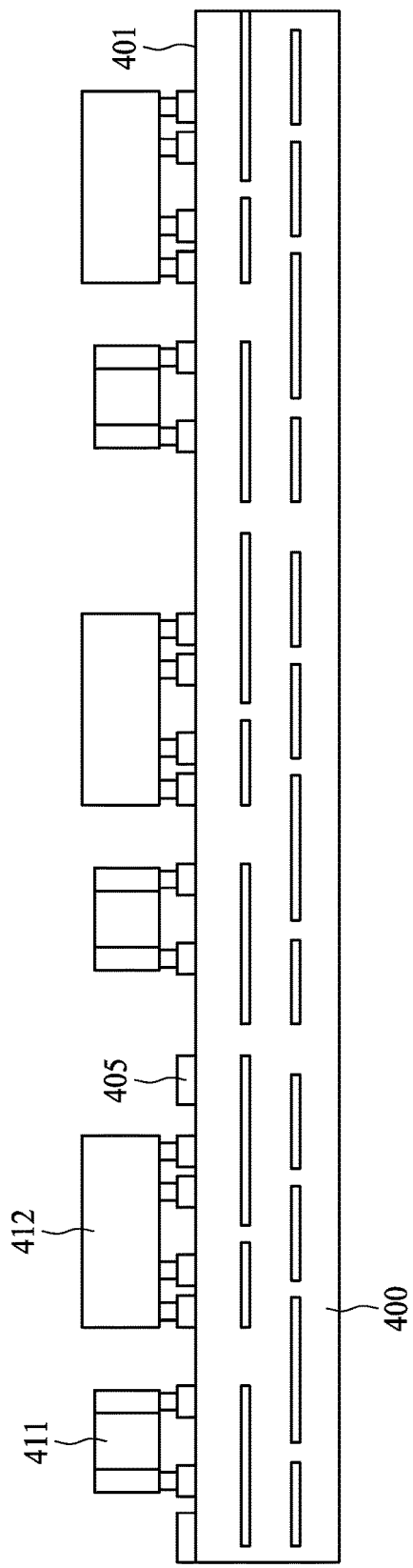
FIG. 4A, FIG. 4B, FIG. 4C, FIG. 4D, FIG. 4E and FIG. 4F illustrate a semiconductor manufacturing method in accordance with some embodiments of the present disclosure.

Referring to FIG. 4A, a substrate strip 400 from which multiple substrates can be formed is provided, and the substrate strip 400 allows multiple semiconductor package devices to be manufactured concurrently. The substrate strip 400 may be, for example, a printed circuit board, such as a paper-based copper foil laminate, a composite copper foil laminate, or a polymer-impregnated glass-fiber-based copper foil laminate. The substrate strip 400 may include an interconnection structure, such as an RDL or a grounding element.

Electronic components 411, 412 are disposed on a top surface 401 of the substrate strip 400. The electronic component 411 may be a passive element, such as a capacitor, a resistor or an inductor. The electronic component 412 may be an active element, such as an IC chip or a die. Each electronic component 411, 412 may be electrically connected to one or more of another electronic component (e.g., electronic components 411, 412) and to the substrate strip 400 (e.g., to the RDL), and electrical connection may be attained by way of flip-chip or wire-bond techniques. In some embodiments, the electronic components 411, 412 are electrically connected to conductive pads 405 on the substrate strip 400.

Figure 4B:
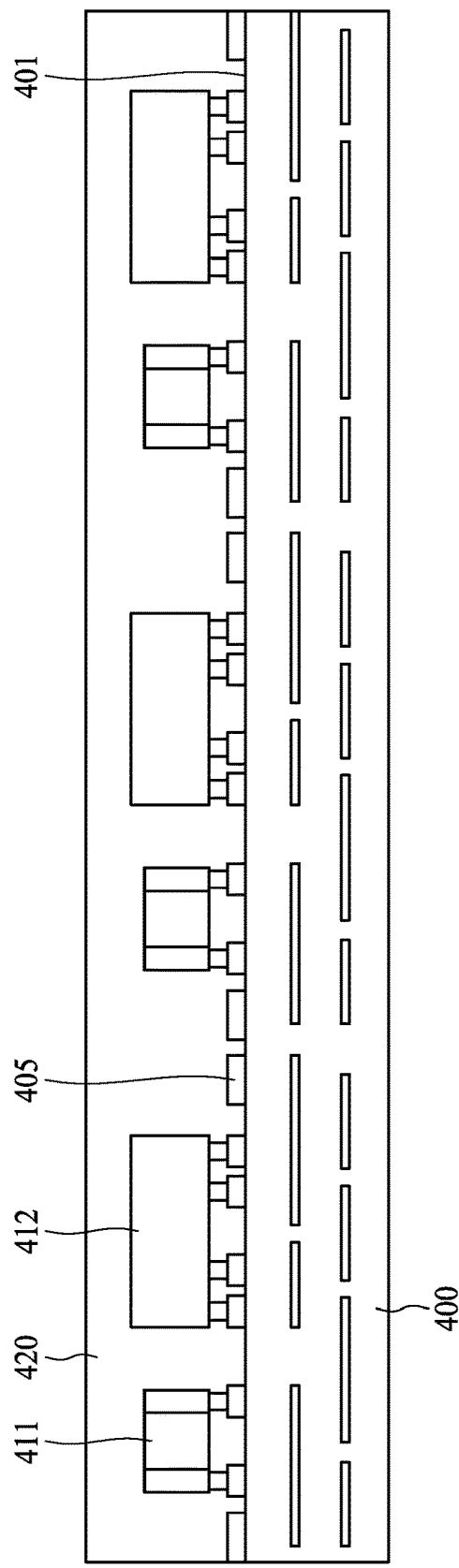

Referring to FIG. 4B, a package body 420 is formed on the top surface 401 of the substrate strip 400 and encapsulates a part of the top surface 401 of the substrate 400 and electronic components 411, 412. In some embodiments, the package body 420 includes an epoxy resin having fillers dispersed therein. The package body 420 may be formed by a molding technique, such as transfer molding or compression molding.

Figure 4C:
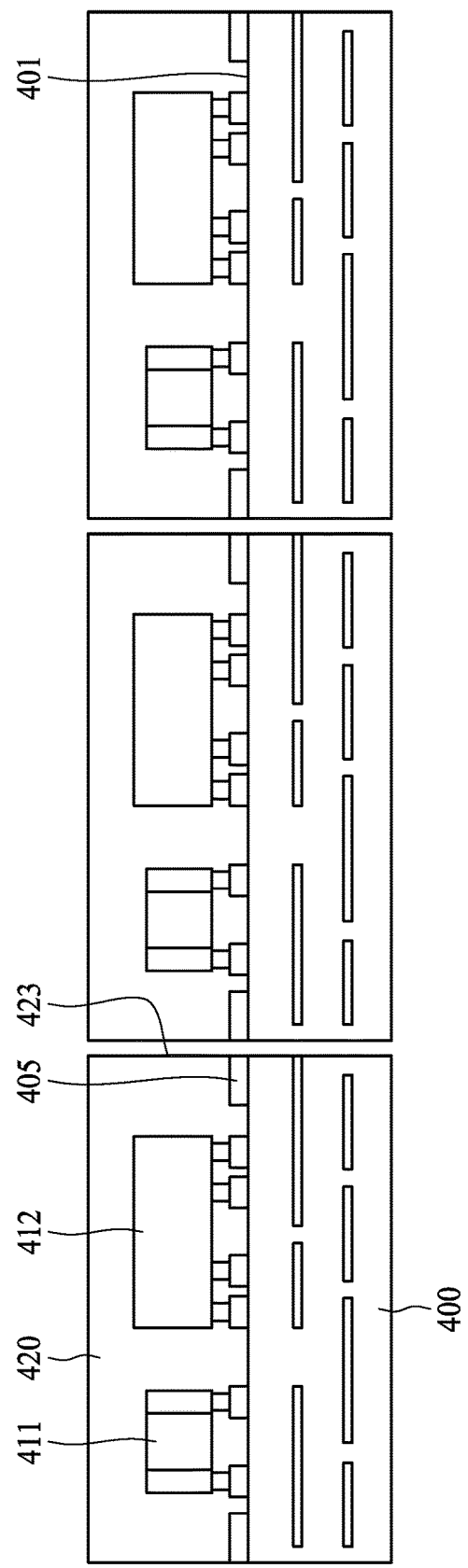

Referring to FIG. 4C, singulation may be performed to separate out individual semiconductor package devices. For example, the singulation is performed through the package body 420 and the substrate strip 400 from which the multiple substrate segments are formed. The singulation may be performed, for example, by using a dicing saw, laser or other suitable cutting technique. After singulation, a plurality of substrate segments of the substrate strip 400 are formed, and a portion of the conductive pad 405 is exposed from a lateral surface 423 of the package body 420. For example, a lateral surface of the conductive pad 405 is substantially coplanar with the lateral surface 423 of the package body 420.

Figure 4D:
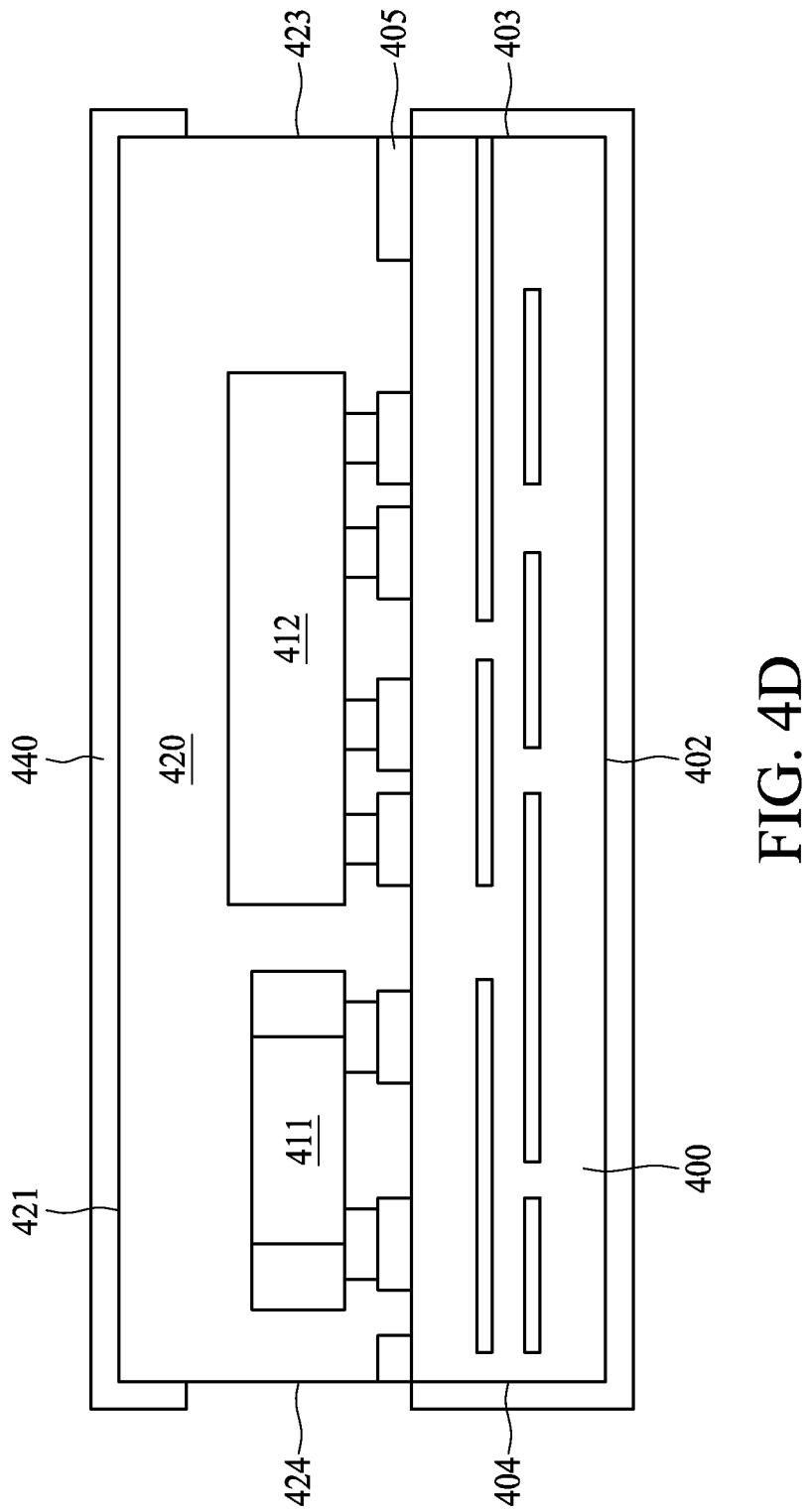

Referring to FIG. 4D, a protection layer 440 is formed to cover a top surface 421 of the package body 420, a portion of lateral surfaces 423, 424 of the package body 420 and lateral surfaces 403, 404 and bottom surface 402 of a segment of the substrate strip 400. A portion of the lateral surfaces 423, 424 of the package body 420 are exposed from the protection layer 440. In some embodiments, the protection layer 440 is a tape or ink.

Figure 4E:
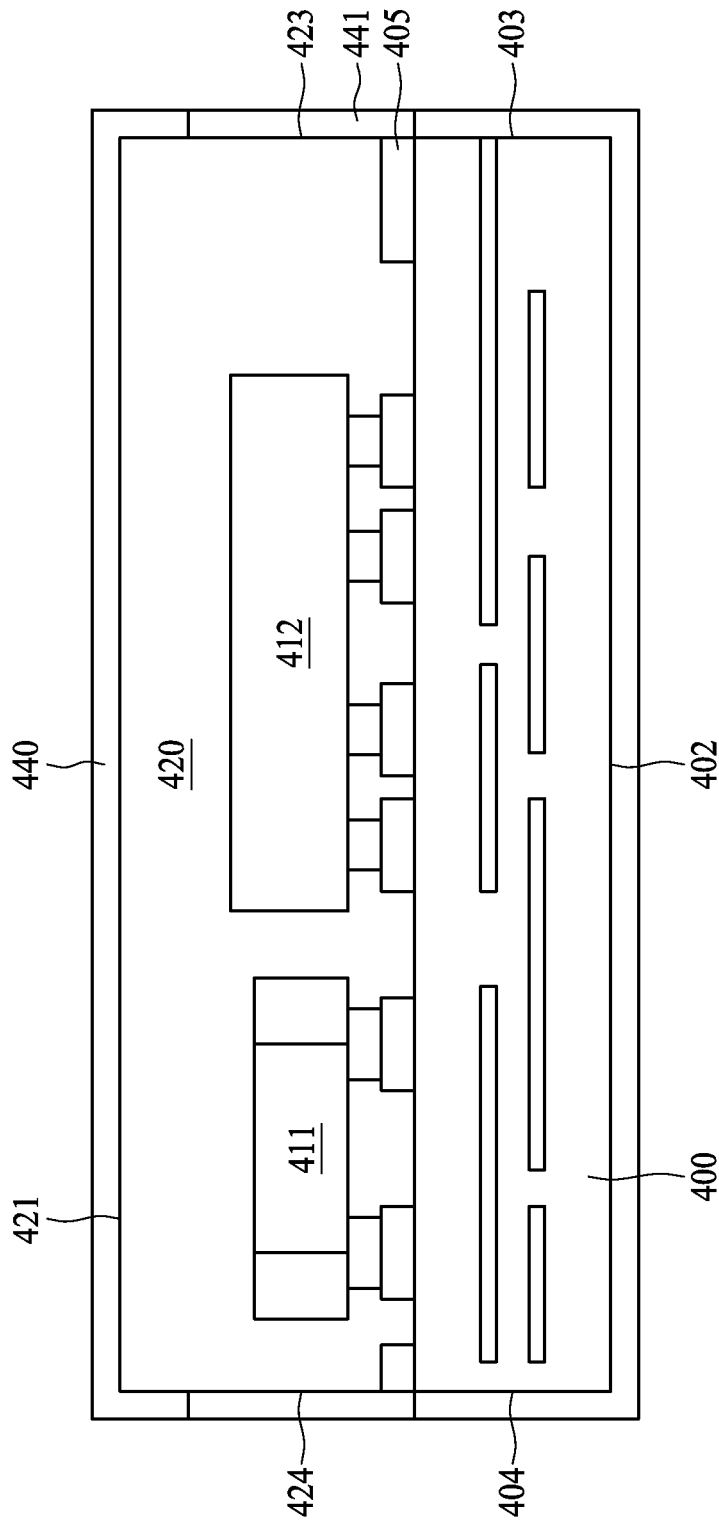

Referring to FIG. 4E, a metal layer 441 is formed on the exposed portion of the lateral surfaces 423, 424 of the package body 420. The metal layer 441 contacts the exposed portion of the conductive pad 405. In some embodiments, the metal layer 441 can be formed by sputtering or spray coating.

Figure 4F:
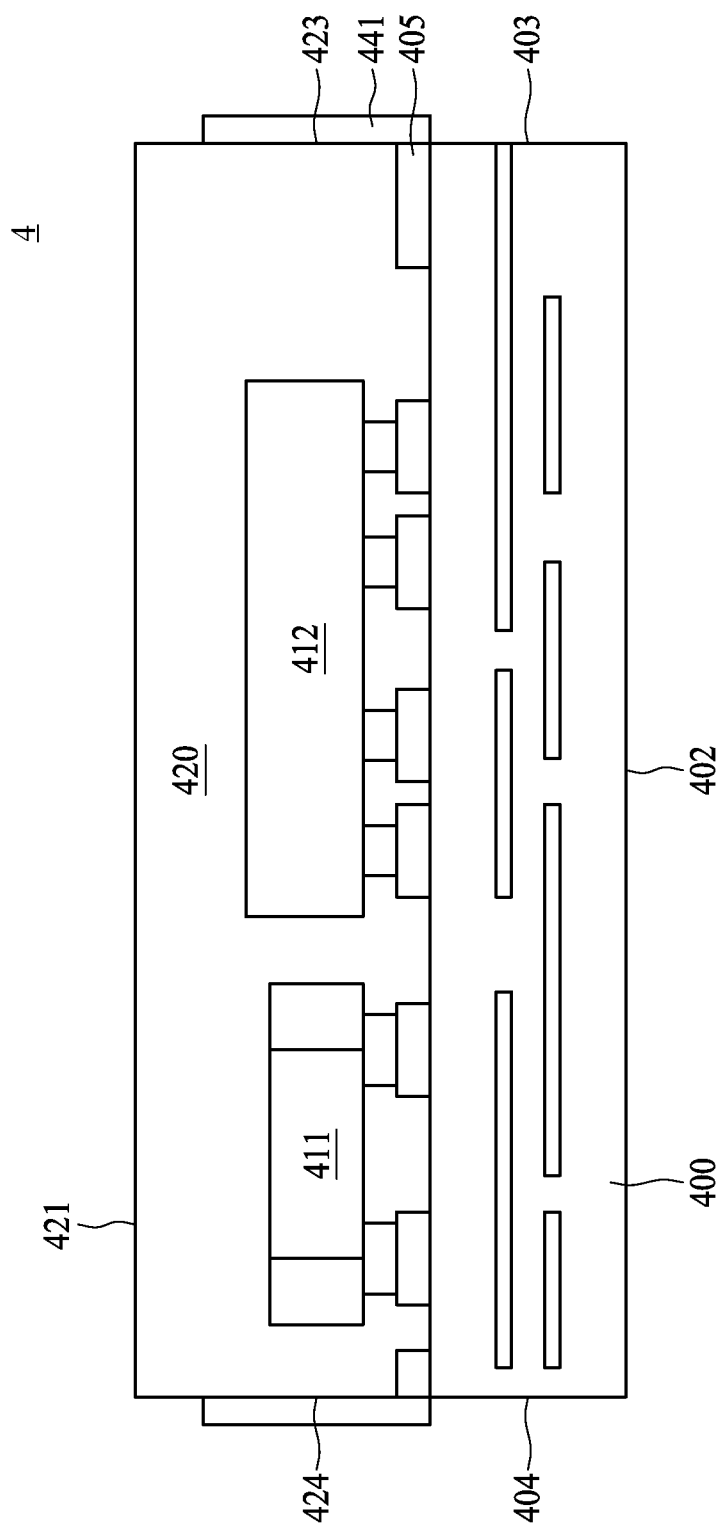

Referring to FIG. 4F, the protection layer 440 is removed to form a semiconductor package device 4. The semiconductor package device 4 is similar to the semiconductor package device 1 shown in FIG. 1 except that the semiconductor package device 4 does not include a through via penetrating the package body 420 to connect the metal layer 441 (or electrode 140A) to the conductive pad 405.

Figure 5A:
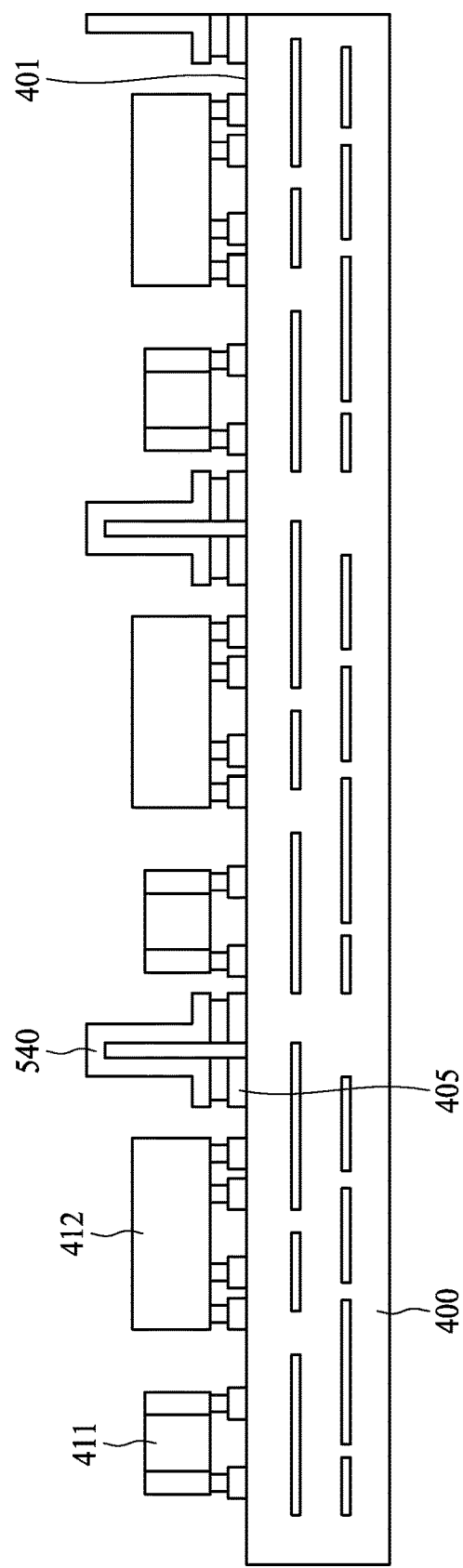
FIG. 5A and FIG. 5B illustrate a semiconductor manufacturing method in accordance with some embodiments of the present disclosure.
Figure 5B:
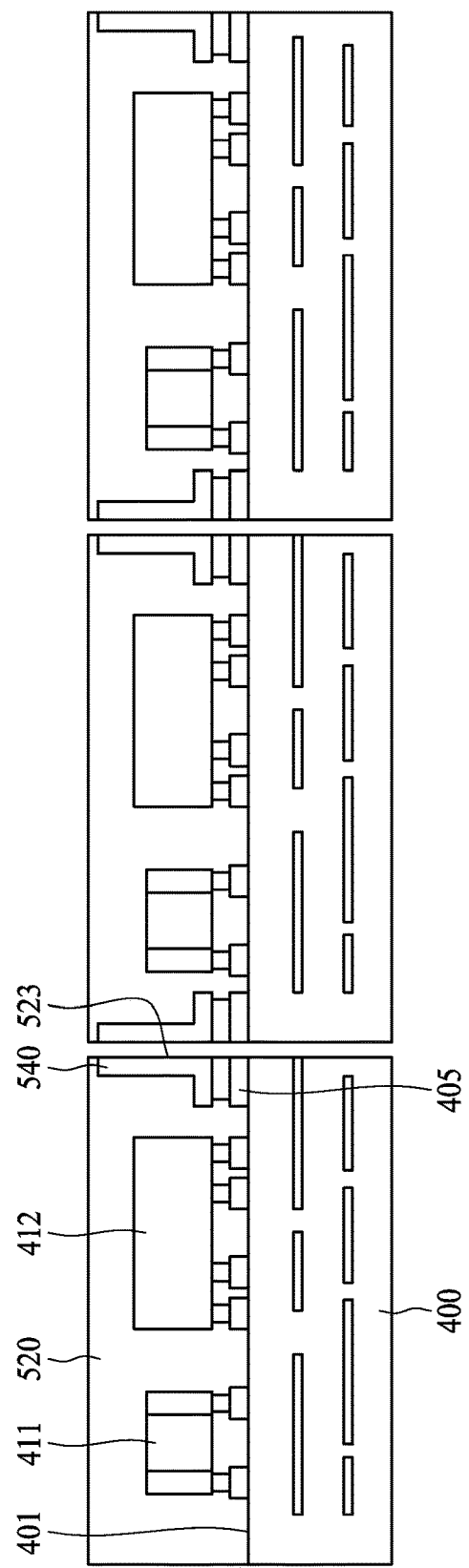

FIGS. 5A and 5B illustrate a method of manufacturing a semiconductor package device in accordance with some embodiments of the present disclosure.

The operation shown in FIG. 5A is similar to that shown in FIG. 4A except that in FIG. 5A, a metal lid 540 is provided to connect the conductive pad 405 on the substrate strip 400 to an adjacent conductive pad on the substrate strip 400. For example, the metal lid 540 connects the conductive pad 405 of a first substrate segment formed from the substrate strip 400 to a conductive pad of an adjacent second substrate segment formed from the substrate strip 400 (e.g., after singulation is performed).

Referring to FIG. 5B, a package body 520 is formed on the top surface 401 of the substrate strip 400 and encapsulates a part of the top surface 401 of the substrate strip 400, electronic components 411, 412 and the metal lid 540. In some embodiments, the package body 520 includes an epoxy resin having fillers dispersed therein. The package body 520 may be formed by a molding technique, such as transfer molding or compression molding.

Then, singulation may be performed to separate out individual semiconductor package devices (e.g., after the package body 520 is formed on the top surface 401 of the substrate strip 400). For example, the singulation is performed through the package body 520 and the substrate strip 400 from which the multiple substrate segments are formed. The singulation may be performed, for example, by using a dicing saw, laser or other suitable cutting technique. After singulation, a portion of the metal lid 540 is exposed from a lateral surface 523 of the package body 520. For example, a lateral surface of the metal lid 540 is substantially coplanar with the lateral surface 523 of the package body 520.

Figure 6A:
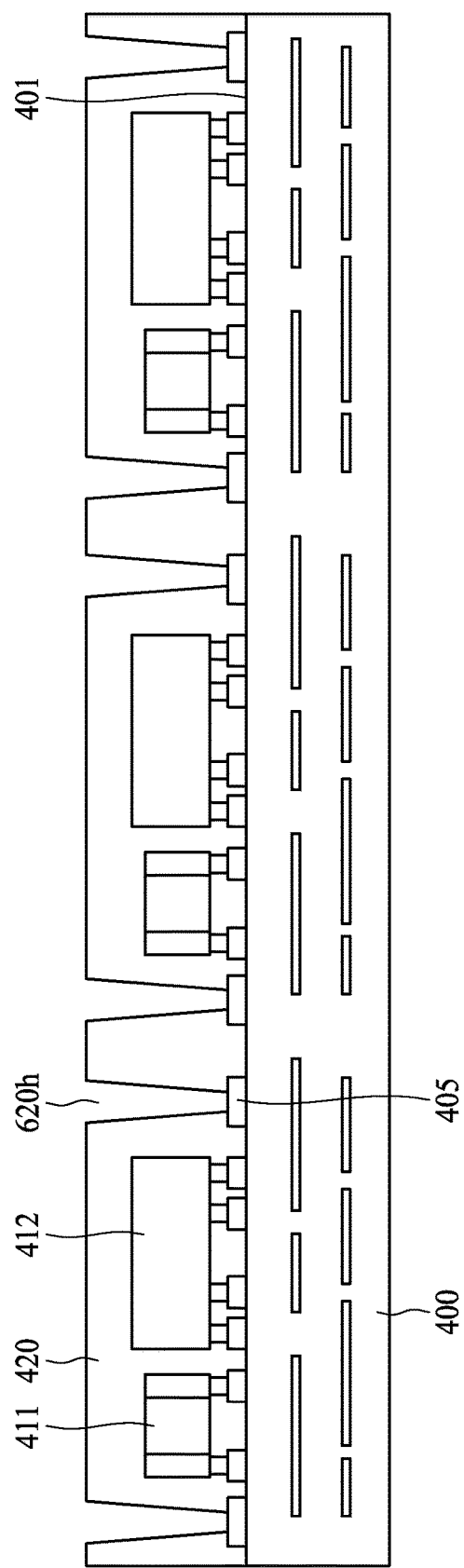
FIG. 6A, FIG. 6B, FIG. 6C and FIG. 6D illustrate a semiconductor manufacturing method in accordance with some embodiments of the present disclosure.

FIGS. 6A-6D illustrate a method of manufacturing a semiconductor package device in accordance with some embodiments of the present disclosure. The operation shown in FIG. 6A is subsequent to the operation shown in FIG. 4B.

Referring to FIG. 6A, a plurality holes 620*h* are formed to penetrate the package body 420 to expose the conductive pads 405 on the substrate strip 400. The holes 620*h* may be formed by, but are not limited to, for example, by laser drilling or etching technology.

Figure 6B:
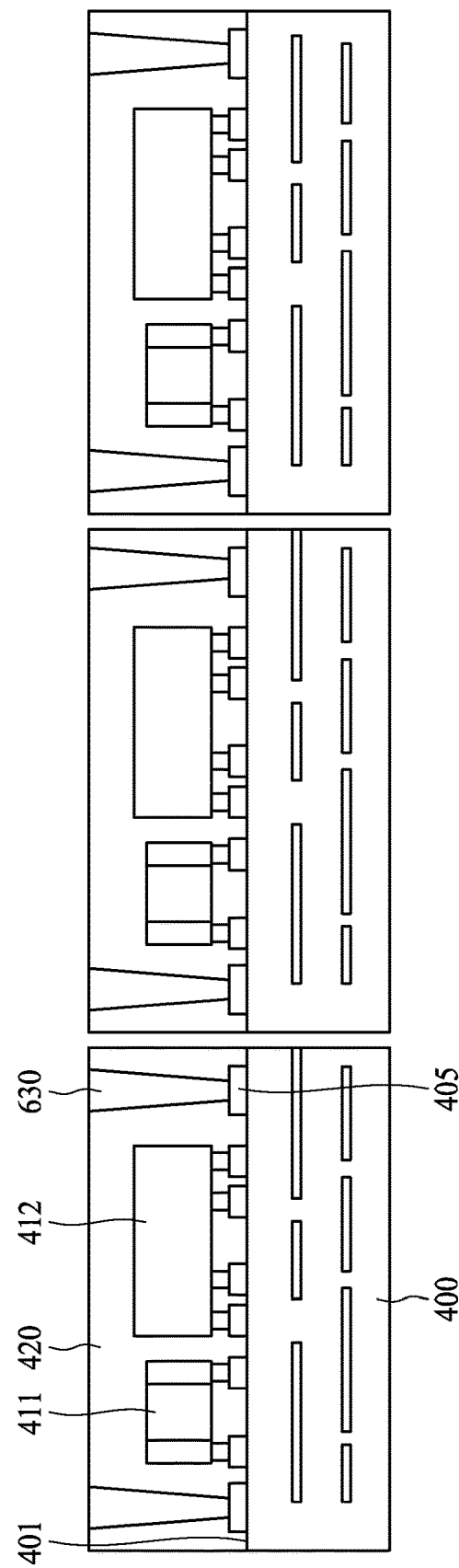

Referring to FIG. 6B, conductive holes or vias 630 are formed by injecting a conductive material into the holes 620*h* to fill the holes 620*h*. Then, singulation may be performed to separate out individual semiconductor package devices. For example, the singulation is performed through the package body 420 and the substrate strip 400 from which the multiple substrate segments are formed. The singulation may be performed, for example, by using a dicing saw, laser or other suitable cutting technique.

Figure 6C:
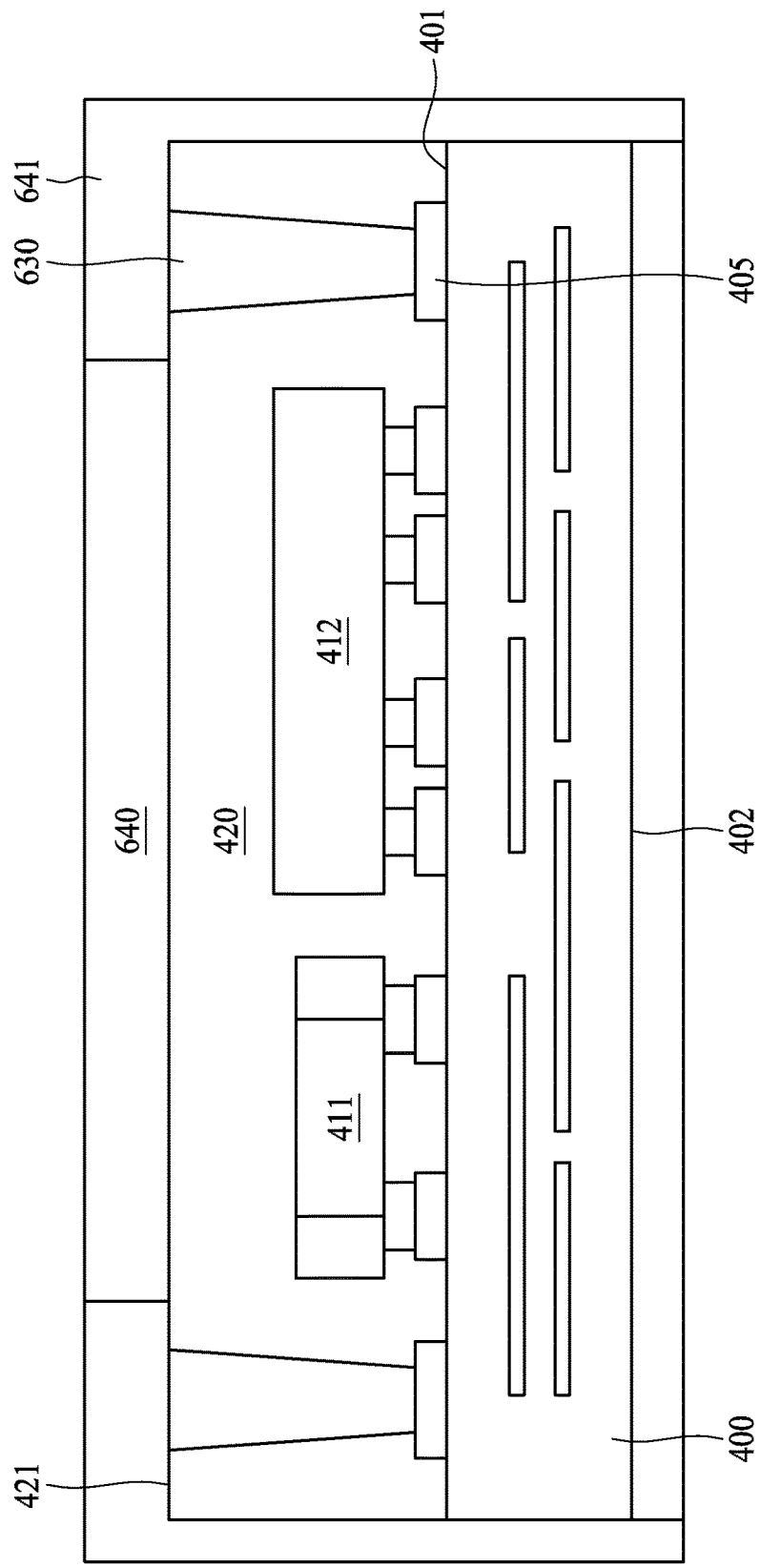

Referring to FIG. 6C, a protection layer 640 is formed to cover a portion of the top surface 421 of the package body 420 and the bottom surface 402 of a segment of the substrate strip 400 formed after singulation. The protection layer 640 is not formed over the conductive holes 630. For example, the protection layer 640 is not overlapping the conductive holes 630. In some embodiments, the protection layer 640 is a tape or ink.

A metal layer 641 is then formed on the exposed portion of the top surface 421 of the package body 420 and lateral surfaces of the package body 420 and the segment of the substrate strip 400. The metal layer 641 contacts the top surface of the vias 630. In some embodiments, the metal layer 641 can be formed by sputtering or spray coating.

Figure 6D:
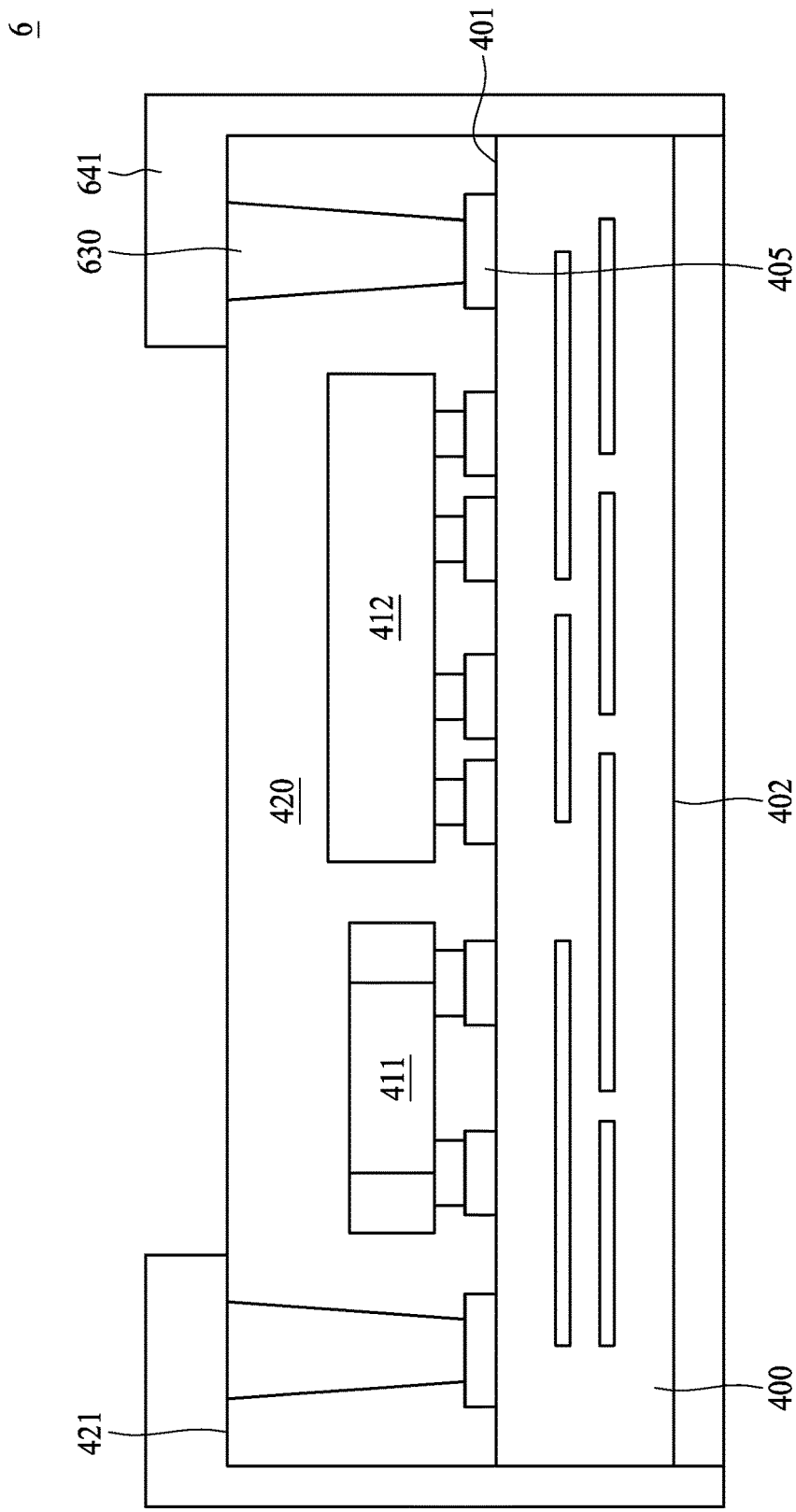

Referring to FIG. 6D, the protection layer 640 is removed to form a semiconductor package device 6. The semiconductor package device 6 is similar to the semiconductor package device 1 shown in FIG. 1 except that the semiconductor package device 6 includes two vias 630 penetrating the package body 420 to connect the metal layer 641 to the corresponding conductive pad 405.

Figure 7A:
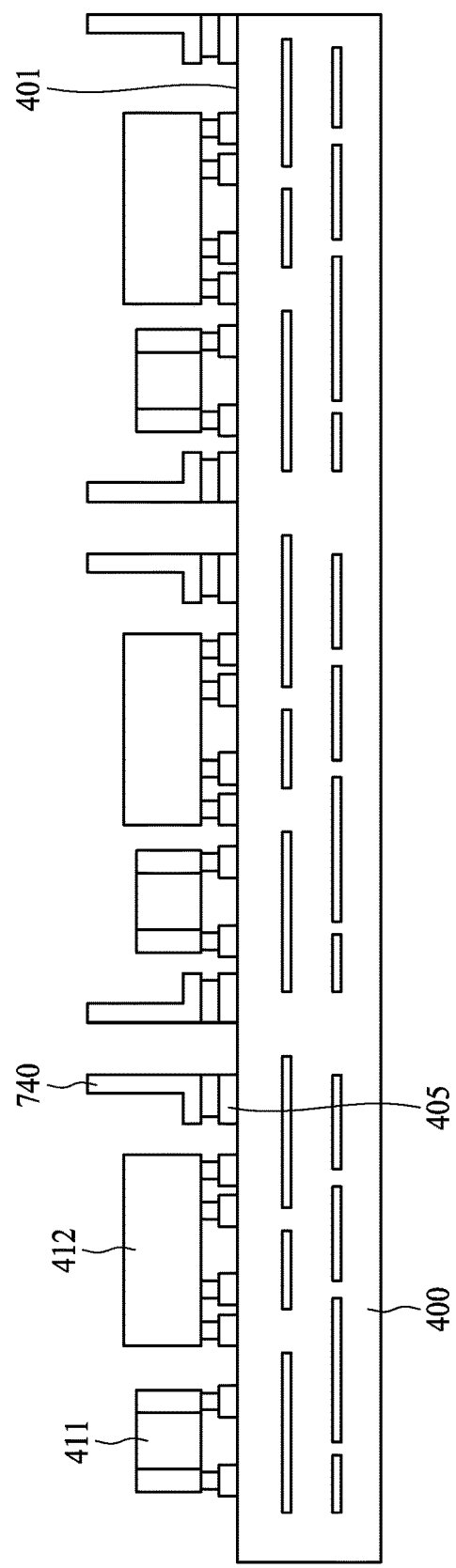
FIG. 7A, FIG. 7B and FIG. 7C illustrate a semiconductor manufacturing method in accordance with some embodiments of the present disclosure.
Figure 7B:
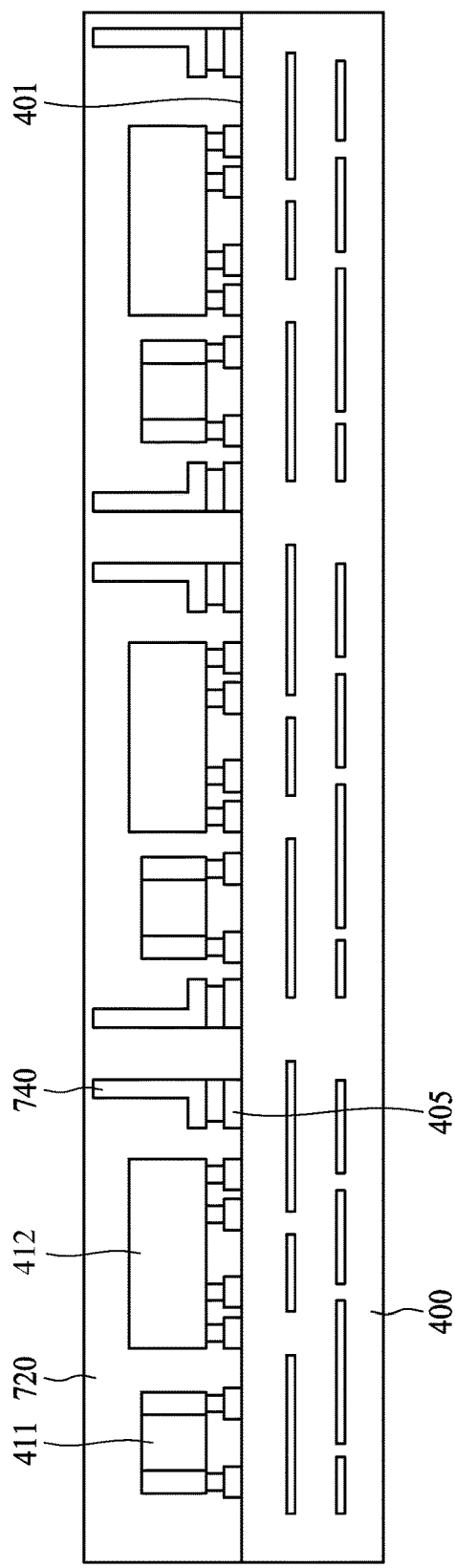
Figure 7C:
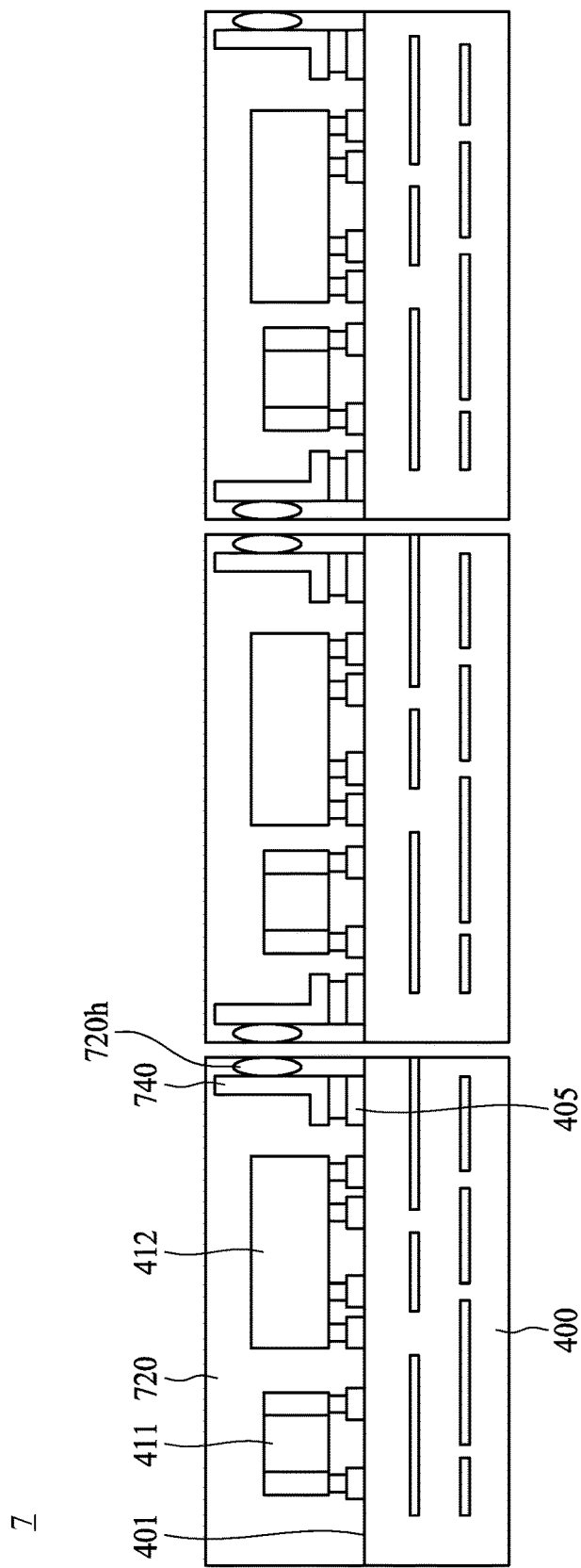

FIGS. 7A-7C illustrate a method of manufacturing a semiconductor package device in accordance with some embodiments of the present disclosure.

The operation shown in FIG. 7A is similar to that shown in FIG. 5A, except that in FIG. 7A, a metal contact 740 on the conductive pad 405 of a segment of the substrate strip 400 is not connected to a metal contact on a conductive pad of an adjacent segment of the substrate strip 400.

Referring to FIG. 7B, a package body 720 is formed on the top surface 401 of the substrate strip 400 and encapsulates a part of the top surface 401 of the substrate strip 400, electronic components 411, 412 and the metal contact 740. In some embodiments, the package body 720 includes an epoxy resin having fillers dispersed therein. The package body 720 may be formed by a molding technique, such as transfer molding or compression molding.

Referring to FIG. 7C, singulation may be performed to separate out individual semiconductor package devices located on segments of the substrate strip 400. For example, the singulation is performed through the package body 720 and the substrate strip 400 from which the substrate segments are formed. The singulation may be performed, for example, by using a dicing saw, laser or other suitable cutting technique.

Then, an opening 720h is formed on the package body 720 to form a semiconductor package device 7. The opening 720h exposes a portion of the metal contact 740. In some embodiments, the opening 720h can be formed by laser drilling or etching. In some embodiments, the exposed portion of the metal contact 740 of a semiconductor package device 7 can be electrically connected to an exposed portion of a metal contact of an adjacent semiconductor package device by a hinge or a conductive wire.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. The term "substantially coplanar" can refer to two surfaces within micrometers (μm) of lying along a same plane, such as within 40 within 30 within 20 within 10 within 5 within 2 within 1 or within 0.5 μm of lying along the same plane.

Additionally, amounts, ratios, and other numerical values are sometimes presented herein in a range format. It can be understood that such range formats are used for convenience and brevity, and should be understood flexibly to include not only numerical values explicitly specified as limits of a range, but also all individual numerical values or sub-ranges encompassed within that range as if each numerical value and sub-range is explicitly specified.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations do not limit the present disclosure. It can be clearly understood by those skilled in the art that various changes may be made, and equivalent components may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. An electronic module, comprising:
    a first sub-module including a first substrate, a first electronic component disposed on the first substrate and a first electrode; and
    a second sub-module including a second substrate, a second electronic component disposed on the second substrate and a second electrode spaced from the first electrode,
    wherein the second electrode faces the first electrode to form a capacitor for transmitting an alternating current (AC) signal between the first sub-module and the second sub-module,
    the first sub-module further comprises a converter configured to convert a first direct current (DC) signal to a converted AC signal and to transmit the converted AC signal to the second sub-module through AC coupling between the first electrode of the first sub-module and the second electrode of the second sub-module; and
    the second sub-module further comprises a converter configured to covert the converted AC signal to a second DC signal.

2. The electronic module of claim 1, further comprising a dielectric material between the first sub-module and the second sub-module.

3. The electronic module of claim 1, wherein:
    the first sub-module further comprises a plurality of electrodes;
    the second sub-module further comprises a plurality of electrodes; and
    each of the plurality of electrodes of the first sub-module faces a corresponding electrode of an adjacent sub-module to form a plurality of capacitors of the electronic module.

4. The electronic module of claim 1, further comprising a hinge connecting the first sub-module to the second sub-module for transmitting a third DC signal between the first sub-module and the second sub-module.

5. The electronic module of claim 4, wherein the hinge connects a connection element of the first sub-module with a connection element of the second sub-module.

6. The electronic module of claim 1, further comprising a conductive line connecting the first sub-module to the second sub-module for transmitting a third DC signal between the first sub-module and the second sub-module.

7. The electronic module of claim 1, wherein the first sub-module further includes a first conductive pad on the first substrate and a first package body encapsulating the first electronic component, the first substrate and the first conductive pad, and wherein the first electrode is formed on a lateral surface of the first package body and is electrically connected to the first conductive pad, a portion of the first conductive pad being exposed from the first package body.

8. The electronic module of claim 1, wherein the first sub-module further includes a first package body encapsulating the first electronic component and the first substrate, and wherein the first electrode is formed on a lateral surface and a top surface of the first package body and is electrically connected to a conductive via on the first substrate and exposed from the top surface of the first package body.

9. The electronic module of claim 1, wherein the first substrate and the second substrate are flexible.

10. A semiconductor package device, comprising:
    a substrate including a first surface and a second surface opposite to the first surface;
    a first electronic component disposed on the first surface of the substrate;
    a first package body disposed on the first surface of the substrate and covering the first electronic component;
    a first electrode disposed on a first lateral surface of the first package body, wherein the first electrode is configured to form an electrode of a capacitor to transmit or receive an alternating current (AC) signal; and
    a second electrode disposed on a top surface of the first package body and a second lateral surface of the first package body opposite to the first lateral surface of the first package body, wherein the second electrode is configured to form an electrode of a capacitor to transmit or receive an AC signal.

11. The semiconductor package device of claim 10, further comprising a conductive pad disposed on the first surface of the substrate and exposed from the first lateral surface of the first package body, wherein the conductive pad is electrically connected to the first electrode.

12. The semiconductor package device of claim 10, further comprising:
    a conductive pad disposed on the first surface of the substrate and encapsulated by the first package body; and
    a conductive via penetrating the first package body to electrically connect the second electrode to the conductive pad.

13. The semiconductor package device of claim 10, further comprising:
    a second electronic component disposed on the second surface of the substrate; and
    a second package body disposed on the second surface of the substrate and covering the second electronic component,
    wherein the first electrode is disposed on a first lateral surface of the second package body and the second electrode is disposed on a second lateral surface of the second package body opposite to the first lateral surface of the second package body.

14. The semiconductor package device of claim 10, further comprising:
    a conductive pad disposed on the first surface of the substrate and encapsulated by the first package body;
    a via disposed on the conductive pad; and
    a hole formed on a first lateral surface of the first package body to expose the via.

15. The semiconductor package device of claim 14, further comprising a conductive line electrically connected to the via through the hole.

16. A flexible electronic module, comprising:
    a first sub-module including a first electronic component and a first electrode electrically connected to the first electronic component; and
    a second sub-module including a second electronic component and a second electrode electrically connected to the second electronic component; and
    a band covering the first sub-module and the second sub-module,
    wherein an alternating current (AC) signal is transmitted between the first electrode of the first sub-module and the second electrode of the second sub-module through AC coupling,
    the first sub-module further comprises a converter configured to convert a first direct current (DC) signal to a converted AC signal and to transmit the converted AC signal to the second sub-module through AC coupling between the first electrode of the first sub-module and the second electrode of the second sub-module; and the second sub-module further comprises a converter configured to covert the converted AC signal to a second DC signal.

17. The flexible electronic module of claim 16, further comprising a hinge covered by the band, wherein the hinge electrically connects the first sub-module to the second sub-module for transmitting a third DC signal therebetween.

18. The flexible electronic module of claim 16, further comprising a conductive line covered by the band, wherein the conductive line electrically connects the first sub-module to the second sub-module for transmitting a third DC signal therebetween.

* * * * *